United States Patent
Lee

(10) Patent No.: US 8,988,626 B2
(45) Date of Patent: Mar. 24, 2015

(54) LIQUID CRYSTAL DISPLAY DEVICE AND METHOD FOR MANUFACTURING THE SAME

(71) Applicant: LG Display Co., Ltd., Seoul (KR)

(72) Inventor: Sangwon Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 13/716,363

(22) Filed: Dec. 17, 2012

(65) Prior Publication Data

US 2013/0286300 A1    Oct. 31, 2013

(30) Foreign Application Priority Data

Apr. 25, 2012    (KR) .................. 10-2012-0043074

(51) Int. Cl.
| | |
|---|---|
| *G02F 1/136* | (2006.01) |
| *G02F 1/1368* | (2006.01) |
| *G02F 1/133* | (2006.01) |
| *G02F 1/1333* | (2006.01) |
| *G06F 3/041* | (2006.01) |

(Continued)

(52) U.S. Cl.
CPC .......... *G02F 1/1368* (2013.01); *G02F 1/13306* (2013.01); *G02F 1/13338* (2013.01); *G06F 3/0412* (2013.01); *G06F 3/044* (2013.01); *G09G 3/3677* (2013.01); *H01L 29/78621* (2013.01); *H01L 21/8232* (2013.01); *H01L 27/1222* (2013.01); *G02F 1/13454* (2013.01); *G02F 2001/134372* (2013.01); *G02F 2202/103* (2013.01); *G02F 2202/104* (2013.01); *G09G 2310/0291* (2013.01); *G09G 2310/061* (2013.01)

USPC ................. 349/43; 349/12; 438/34; 438/231; 438/289; 438/151; 257/72; 257/411

(58) Field of Classification Search
CPC ..................... H01L 29/78621; H01L 27/1222; G02F 1/13333
USPC ............... 349/43, 12; 438/34, 231, 289, 151; 257/72, 411
See application file for complete search history.

(56) References Cited

U.S. PATENT DOCUMENTS

| | | | |
|---|---|---|---|
| 6,096,585 A | 8/2000 | Fukuda et al. | |
| 6,310,670 B1 | 10/2001 | Lee | |

(Continued)

FOREIGN PATENT DOCUMENTS

| | | |
|---|---|---|
| EP | 1 022 786 A2 | 7/2000 |
| JP | H08-160464 A | 6/1996 |

(Continued)

OTHER PUBLICATIONS

Alex Ching-Wei et al: "LTPS circuit integration for system-on-glass LCD's", Journal of the SID, vol. 14, No. 4, Jan. 1, 2006, pp. 353-361, XPO55067809.

*Primary Examiner* — Edward Glick
*Assistant Examiner* — Sang V Nguyen
(74) *Attorney, Agent, or Firm* — Morgan, Lewis & Bockius LLP

(57) ABSTRACT

A liquid crystal display device and method for manufacturing the same are provided. A liquid crystal display (LCD) with a touch function includes: a pixel thin film transistor (TFT) in a display area, and a buffer TFT of a gate driver in a non-display area, wherein a lightly-doped drain (LDD) length of the buffer TFT is shorter than a lightly doped drain (LDD) length of the pixel TFT.

13 Claims, 16 Drawing Sheets

(51) Int. Cl.
  *G06F 3/044* (2006.01)
  *G09G 3/36* (2006.01)
  *H01L 29/786* (2006.01)
  *H01L 21/8232* (2006.01)
  *H01L 27/12* (2006.01)
  *G02F 1/1345* (2006.01)
  *G02F 1/1343* (2006.01)

(56) References Cited

U.S. PATENT DOCUMENTS

| | | | |
|---|---|---|---|
| 2003/0117083 A1* | 6/2003 | Koyama | 315/169.3 |
| 2005/0074914 A1* | 4/2005 | Chang et al. | 438/48 |
| 2008/0017937 A1* | 1/2008 | Morimoto et al. | 257/411 |
| 2008/0151162 A1* | 6/2008 | Lee et al. | 349/116 |
| 2009/0224255 A1* | 9/2009 | Kitakado et al. | 257/72 |
| 2010/0010996 A1 | 1/2010 | Petrocelli et al. | |
| 2010/0327354 A1* | 12/2010 | Jang et al. | 257/347 |
| 2011/0075063 A1 | 3/2011 | Tajiri et al. | |
| 2012/0056835 A1 | 3/2012 | Choo et al. | |
| 2012/0069259 A1 | 3/2012 | Oh et al. | |
| 2012/0256883 A1 | 10/2012 | Okada et al. | |
| 2012/0268453 A1* | 10/2012 | Hwang et al. | 345/419 |

FOREIGN PATENT DOCUMENTS

| | | |
|---|---|---|
| JP | 10-189998 A | 7/1998 |
| JP | H10-268254 A | 10/1998 |
| JP | 2000-208774 A | 7/2000 |
| JP | 2008-165028 A | 7/2008 |
| JP | 2011-070055 A | 4/2011 |
| JP | 2012-59265 A | 3/2012 |
| KR | 10-2008-0013262 A | 2/2008 |
| WO | 2011/077855 A | 6/2011 |

* cited by examiner

<Active area TFT>

<GIP buffer TFT & tail TFT>

<bottom gate TFT>

< top gate TFT >

LDD length ratio
A > B > C

< Active area TFT >

< GIP buffer TFT >

< tail TFT >

LIQUID CRYSTAL DISPLAY DEVICE AND METHOD FOR MANUFACTURING THE SAME

CROSS REFERENCE TO RELATED APPLICATION(S)

This application claims the benefit under 35 U.S.C. §119 (a) of Korean Patent Application No. 10-2012-0043074, filed on Apr. 25, 2012, in the Korean Intellectual Property Office, the entire disclosure of which is incorporated by reference herein for all purposes.

BACKGROUND

1. Technical Field

The present disclosure relates to a flat display device, and more particularly, to a liquid crystal display (LCD) device with a touch function which facilitates improved display and touch sensing performance, and a method for manufacturing the same.

2. Discussion of the Related Art

As a substitute for an input device such as a mouse or a keyboard according to the related art, a touch screen is widely used, wherein the touch screen facilitates direct input of information to a screen through the use of finger or pen/stylus. Thus, an application of the touch screen is gradually increased owing to an advantage of easy operation.

When the touch screen is applied to an LCD device, the touch screen is provided inside a thin film transistor (TFT) array substrate (lower substrate) of a liquid crystal panel to obtain slimness. To decrease a thickness of device, the touch screen and the liquid crystal panel are formed as one body.

For example, an in-cell touch type LCD device has been developed, wherein a common electrode on the TFT array substrate functions as a touch electrode, and a sensing line (RX line and TX line) for connection of the common electrode (touch electrode) is additionally formed.

FIG. 1 illustrates an LCD device according to the related art.

With reference to FIG. 1, an active area 10 for displaying images is formed on a TFT array substrate, and the active area 10 is provided with a plurality of pixels formed in a matrix configuration.

Also, a non-display area is formed in the periphery of the active area 10. At one side of the non-display area, there is a GIP (gate-in-panel) type gate driver 20 among driving circuits. At the other side of the non-display area, there is a pad 30 for connecting the active area 10 with the driving circuits.

FIG. 2 illustrates problems of the LCD device according to the related art.

With reference to FIG. 2, the pixel is defined by crossing a gate line 40 and a data line 50. Adjacent to a crossing portion of the gate line 40 and the data line 50, a thin film transistor (TFT) is formed.

For a common electrode to function as a touch electrode, a sensing line is formed on the TFT array substrate, to thereby connect the common electrodes in the X-axis direction and Y-axis direction.

For example, the sensing line may comprise a driving line (TX line) 60 supplied with a touch driving signal, and a receiving line (RX line) 70 for detecting a capacitance according to the touch driving signal.

For a display period, a common voltage (Vcom) is supplied to the common electrode, to thereby display images. For a non-display period, the common electrode is driven as the touch electrode, to thereby sense the change of capacitance according to a touch.

In order to improve reliability of LTPS (low temperature polysilicon)-based TFT and leakage current characteristics of TFT off-state, a lightly doped drain (LDD) region is formed by lightly doping source and drain regions of TFT with a dopant. In this case, driving reliability and current-voltage (I-V) characteristics of the TFT are largely influenced by an LDD length.

According to the reliability of TFT and TFT off-state characteristics, the LCD device according to the related art is designed to have the same LDD length both in the TFT of the active area and the TFT of the GIP buffer 22. Thus, an interference occurs between display driving and touch driving due to deterioration of ON-State Resistance ($R_{on}$) characteristics of the TFT.

The LDD of the TFT in the GIP buffer 22 of the in-cell touch type liquid crystal panel is formed to improve the reliability and TFT off-state characteristics. However, the LDD occupies 70-80% of the entire resistance of TFT, which causes the increase of series resistance between source and drain. Thus, while the TFT reliability and TFT off-state characteristics are improved by the LDD, the touch characteristics are deteriorated due to the deteriorated $R_{on}$ characteristics.

In the in-cell type touch panel, structures for the touch driving are provided inside the liquid crystal panel, whereby the interference occurs between displaying characteristics and touch driving characteristics. Improving the $R_{on}$ characteristics of the TFT decreases the interference between display driving and touch driving.

The touch driving signal for the touch driving leaks into a parasitic capacitance ($C_{DTX}$, $C_{GD}$, $C_{DRX}$, $C_{GRX}$, $C_{Mu}$) inside the panel, thereby causing noise. Improving the $R_{on}$ characteristics of the TFT removes the noise.

For improvement of the $R_{on}$ characteristics of TFT, the LDD length is decreased. However, since the LDD length has effects on the reliability of TFT and the TFT off-state characteristics, it is difficult to decrease the LDD length.

To improve the touch characteristic, the LDD length has to be designed in consideration of the decrease of leakage current in the active area 10 and the uniformity of parasitic capacitance. However, the related art does not overcome these problems.

SUMMARY

Embodiments of the present invention relate to a liquid crystal display device and method for manufacturing the same. Accordingly, embodiments of the present invention are directed to provide an array substrate of LCDs and a manufacturing method thereof that substantially obviate one or more problems due to limitations and disadvantages of the related art.

An object is to provide an LCD device which decreases an interference between display driving and touch driving of an in-cell type touch panel, and a method for manufacturing the same.

Another object is to provide an LCD device which improves $R_{on}$ characteristics of TFT, and a method for manufacturing the same.

Another object of embodiments is to provide an LCD device which decreases noise inside a liquid crystal panel on a touch-driving mode, and a method for manufacturing the same.

Another object is to provide an LCD device in which an LDD length is designed in consideration of reliability of GIP buffer TFT, and a method for manufacturing the same.

Another object is to provide an LCD device in which an LDD length is designed in consideration of leakage current characteristics of TFT off-state and uniformity of parasitic capacitance inside the panel (gate to source/drain capacitance).

A further object is to provide an LCD device in which an LDD length of a tail TFT connected with a GIP buffer is designed in consideration of $R_{on}$ characteristics of the TFT.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided a liquid crystal display (LCD) with a touch function, including: a pixel thin film transistor (TFT) in a display area, and a buffer TFT of a gate driver in a non-display area, wherein a lightly-doped drain (LDD) length of the buffer TFT is shorter than a lightly doped drain (LDD) length of the pixel TFT.

In another aspect, there is provided a method for manufacturing an LCD device with a touch function, the method including: forming a pixel thin film transistor (TFT) with a lightly doped drain (LDD) having a first length in a display area, forming a buffer TFT of a gate driver with an LDD having a second length in a non display area, wherein the second length is shorter than the first length.

It is to be understood that both the foregoing general description and the following detailed description are examples and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
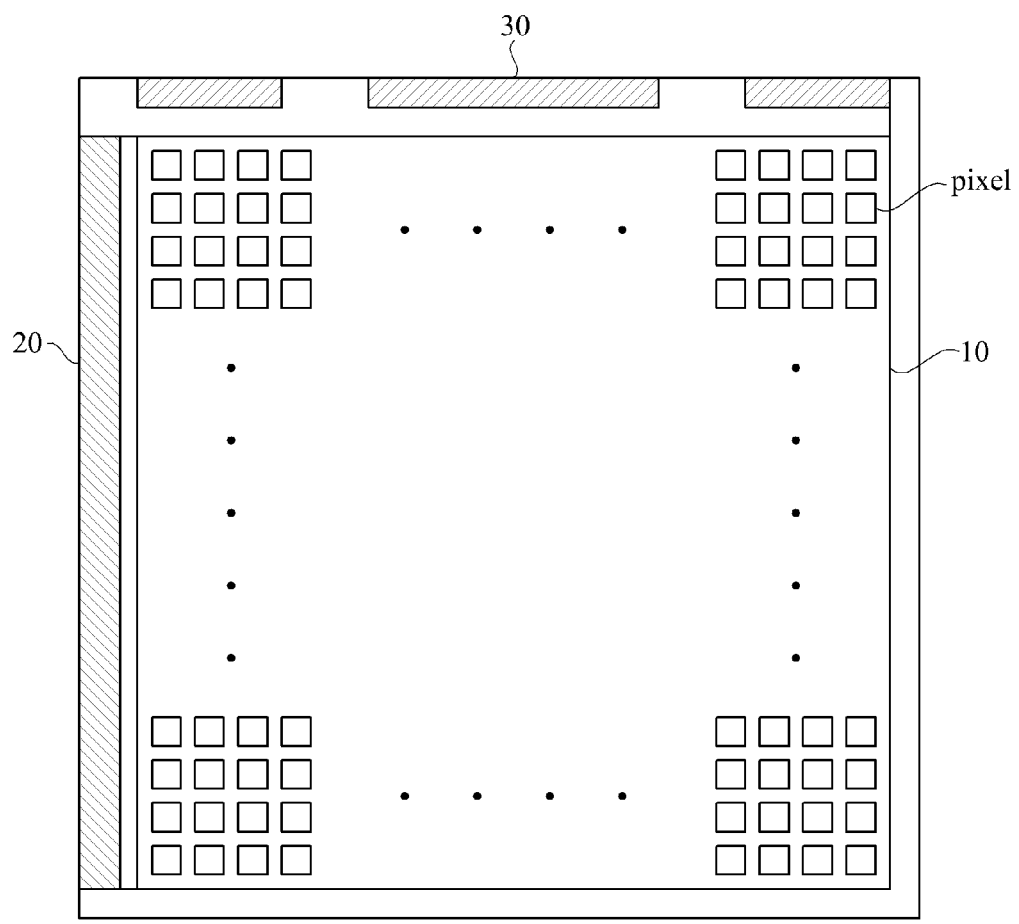
FIG. 1 illustrates an LCD device according to the related art.
Figure 2:
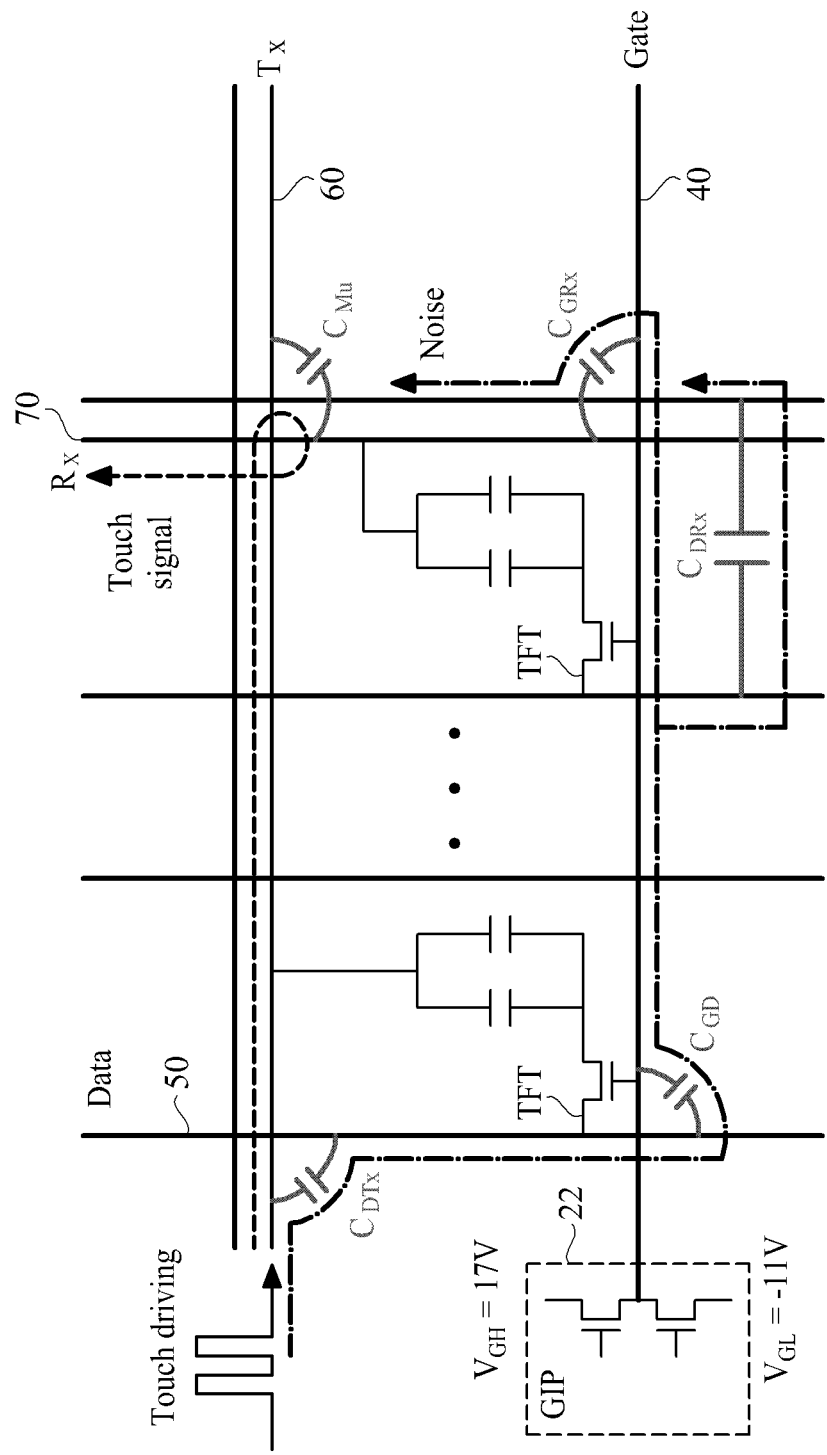
FIG. 2 illustrates problems of the LCD device according to the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE INVENTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In description of embodiments of the present invention, when a structure is described as being positioned "on or above" or "under or below" another structure, this description should be construed as including a case in which the structures contact each other as well as a case in which a third structure is disposed therebetween.

Hereinafter, a liquid crystal display (LCD) device according to the present disclosure and a method for manufacturing the same will be described with reference to the accompanying drawings.

Before a detailed explanation with reference to the accompanying drawings is given, various modes of the LCD device will be briefly described. Based on a method for controlling alignment of liquid crystal layer, the LCD device may be classified into Twisted Nematic (TN) mode, Vertical Alignment (VA) mode, In-Plane Switching (IPS) mode, Fringe Field Switching (FFS) mode, etc.

In an example of the IPS mode and FFS mode, among the above modes, pixel and common electrodes may be formed on a lower substrate, and the alignment of liquid crystal layer may be controlled by an electric field formed between the pixel and common electrodes.

In an example of the IPS mode, the pixel and common electrodes may be alternately arranged in parallel so that an in-plane electric field parallel to the substrates occurs between the pixel and common electrodes, to control the alignment of liquid crystal layer. In an example of the IPS mode, the alignment of liquid crystal layer may not be controlled in the upper portions of the common electrode and pixel electrode, so that a light transmittance may be lowered in the upper portions of the common electrode and pixel electrode.

The FFS mode has been designed to overcome disadvantages of the IPS mode. In an example of the FFS mode, the pixel and common electrodes may be formed with a predetermined interval by an insulating layer interposed therebetween. In this case, one of the pixel and common electrodes may be formed in a plate shape or pattern, and the other may be formed in a finger shape. Thus, the alignment of liquid crystal layer may be controlled by a fringe field occurring between the pixel and common electrodes.

The LCD device with a touch screen according to an embodiment of may have a structure of the FFS mode. Also, a thin film transistor (TFT) array substrate (lower substrate) may be formed of low temperature polysilicon (LTPS).

The LCD device with a touch screen according to an embodiment may include an in-cell touch type liquid crystal panel with touch screen for detecting a user's touch location, a backlight unit for supplying light to the liquid crystal panel, and a driving circuit.

The driving circuit may include a timing controller (T-con), a data driver (D-IC), a gate driver (G-IC), a touch sensing driver, a backlight driver, and a power supplier.

In one example, the driving circuit may be totally or partially formed on the TFT array substrate (lower substrate) of the liquid crystal panel by COG (Chip On Glass) or COF (Chip On Flexible Printed Circuit, Chip On Film).

Figure 3:
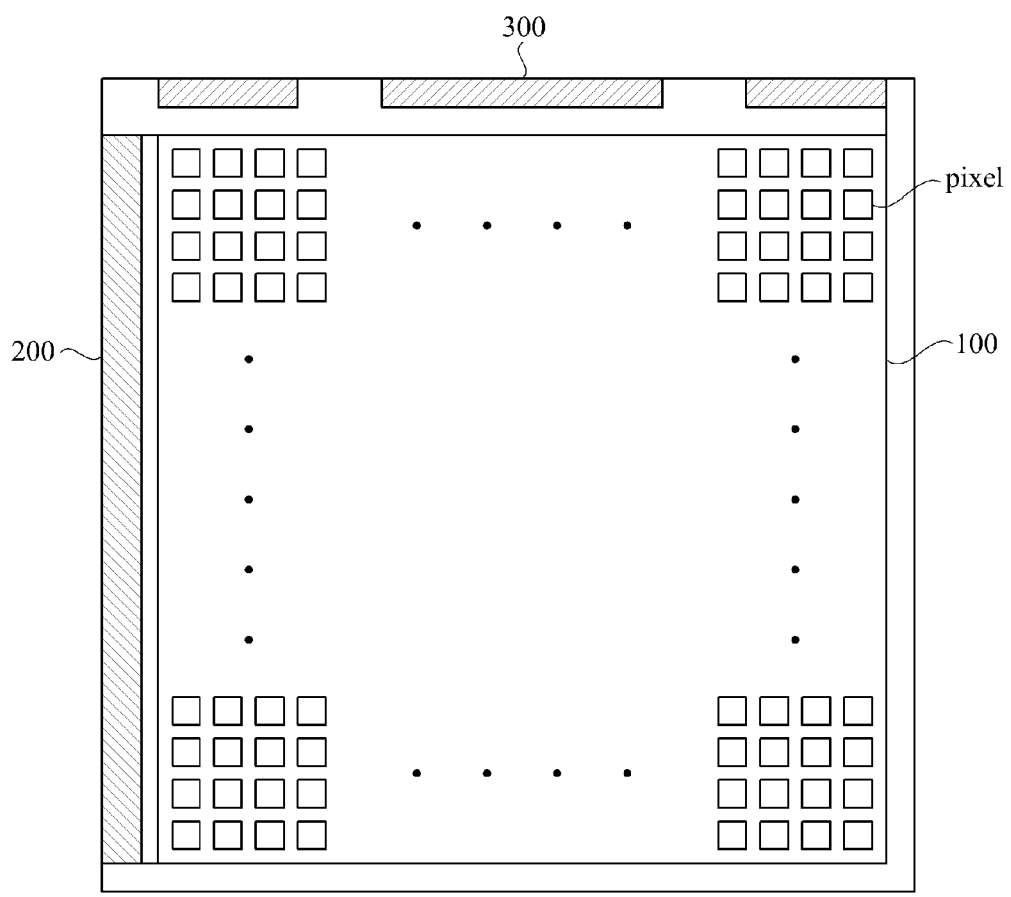
FIGS. 3 and 4 illustrate an LCD device according to an example embodiment.
Figure 4:
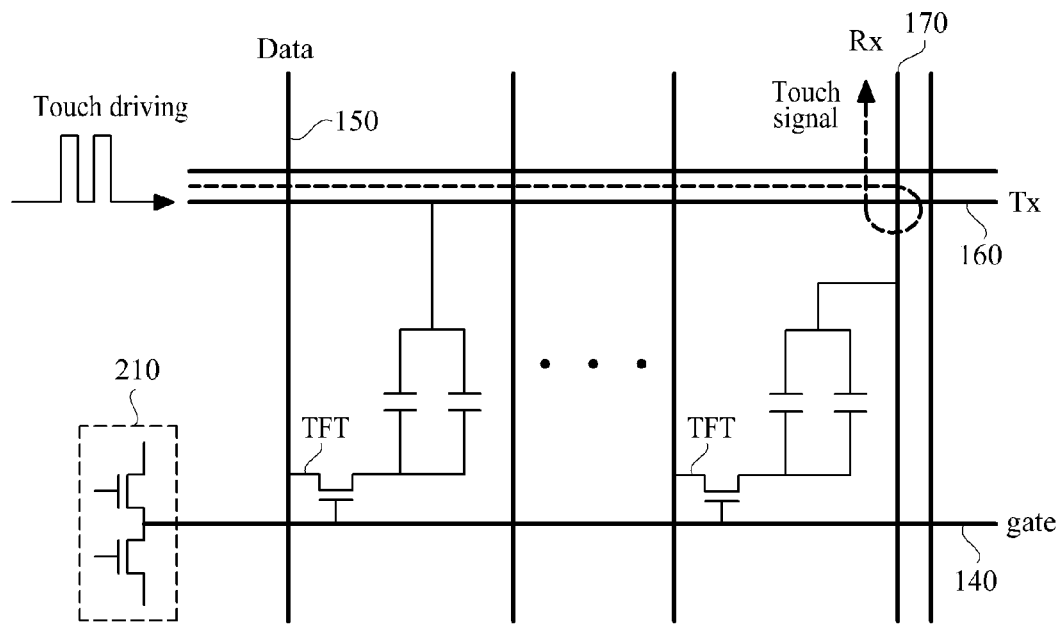

FIGS. 3 and 4 illustrate an LCD device according to an example embodiment. In an example of the LCD device according to an embodiment, a touch screen of an in-cell touch type may be provided in a TFT array substrate.

Among structures of the LCD device with touch screen according to an embodiment, FIG. 3 shows a color filter array substrate (upper substrate), a liquid crystal layer, and a GIP 200, except a driving circuit.

With reference to FIGS. 3 and 4, an active area 100 for displaying images may be formed on the TFT array substrate, wherein the active area 100 may be provided with a plurality of pixels arranged in a matrix configuration. Herein, the active area 100 may be a display area for display images.

Also, a non-display area may be formed in the periphery of the active area 100. Among the driving circuits, a gate driver of a GIP (gate-in-panel) method may be used at one side of the non-display area. Meanwhile, the gate driver may be formed by an ASG (amorphous-silicon-gate) method. At the other side of the non-display area, there may be a pad 300 for connecting the active area 100 with the driving circuit.

FIG. 3 illustrates that the GIP 200 may be formed at the left side of the liquid crystal panel. Instead of this arrangement, the GIP 200 may be formed, e.g., at the right, upper, or lower side on the periphery of the liquid crystal panel. Also, FIG. 3 illustrates that the pad 300 may be formed at the upper side on the periphery of the liquid crystal panel. Instead, the pad 300 may be formed, e.g., at the left, right, or lower side on the periphery of the liquid crystal panel.

As shown in FIG. 4, the plurality of pixels may be defined by crossing gate and data lines 140 and 150. In one example, a thin film transistor (TFT) may be formed at every pixel defined by the gate and data lines 140 and 150. Also, a common electrode (Vcom electrode) and a pixel electrode may be formed in the plurality of pixels.

In the GIP 200, there may be channels whose number corresponds to the number of gate lines 140. Each channel of the GIP 200 may supply a scan pulse to the gate line 140 through a GIP buffer 210, to turn on the pixel TFT. FIG. 4 shows that the GIP buffer 210 of one channel may include double (two) TFTs. However, the number of TFTs constituting the GIP buffer 210 is not limited thereto.

For the common electrode to function as a touch electrode, a sensing line may be formed on the TFT array substrate, to connect the common electrodes in the X-axis direction and Y-axis direction.

For example, the sensing line may include a driving line (TX line) 160 supplied with a touch driving signal, and a receiving line (RX line) 170 for detecting a capacitance according to the touch driving signal.

Figure 5:
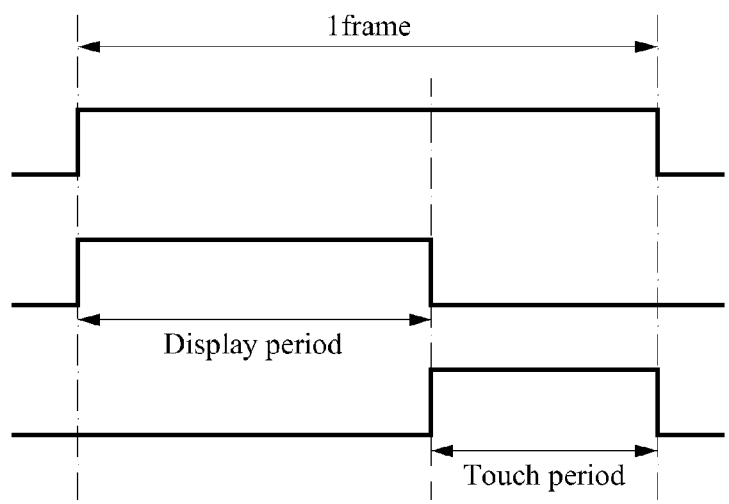
FIG. 5 illustrates displaying and touch driving methods of the LCD device according to an example embodiment.

FIG. 5 illustrates display and touch driving implementations of the LCD device according to an example embodiment.

In relation to FIG. 5, one frame period (1 frame period) may include a display period, and a non-display period corresponding to a touch period.

For the display period of 1 frame, the scan signal may be sequentially supplied to the gate line 140 through all of the GIP buffers 210 of the GIP 200, to turn on the pixel TFT. When the pixel TFT is turned-on, a data voltage may be supplied to the data line 150, and a common voltage (Vcom) may be supplied to the common electrode, to display images.

For the non-display period of the touch period, the pixel TFT may be turned off so that the common electrode is driven as the touch electrode, to sense the change of capacitance according to a user's touch.

In one example, the touch driving signal may be supplied to the driving line (TX line) 160, and the receiving line (RX line) 170 may sense the change of capacitance according to the user's touch.

Figure 6:
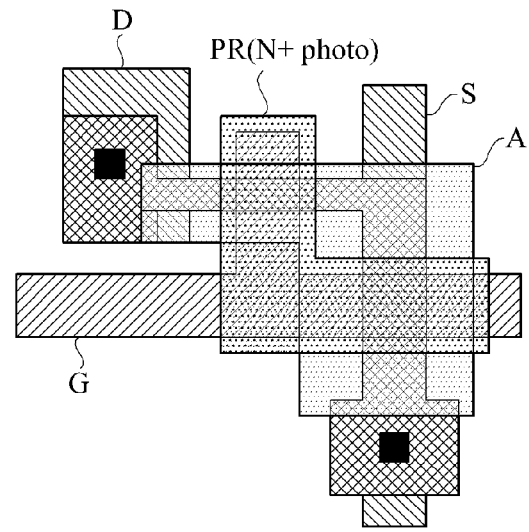
FIG. 6 is a plane view illustrating a pixel TFT in the LCD device according to an example embodiment.
Figure 7:
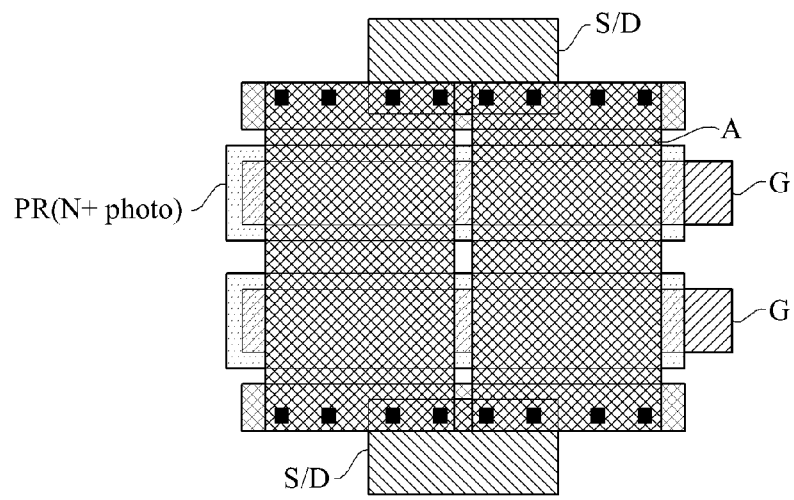
FIG. 7 is a plane view illustrating a TFT of GIP buffer in the LCD device according to an example embodiment.

FIG. 6 is a plane view illustrating the pixel TFT in the LCD device according to an example embodiment. FIG. 7 is a plane view illustrating the TFT of the GIP buffer in the LCD device according to an example embodiment.

With reference to FIGS. 6 and 7, the pixel TFT of the active area 100 and the TFT of the GIP buffer 210 may respectively include a gate G connected with the gate line 140, an active area A, a source S connected with the data line 150, and a drain D connected with the pixel electrode. Between the gate G and the active area A, there may be a gate insulating layer GI.

The pixel TFT of the active area 100 and the TFT of the GIP buffer 210 may include a lightly doped drain (LDD) to enhance display and touch driving characteristics and to improve reliability and TFT off-state characteristics. In one example, an LDD length of the pixel TFT may be different from an LDD length of the TFT of the GIP buffer 210.

The LDD of the TFT will now be described in more detail. The LDD may be formed by firstly forming a TFT semiconductor layer of amorphous silicon (a-Si:H) or low temperature polysilicon (P-Si); and secondly forming the gate insulating layer (GI) and gate G on the semiconductor layer.

In an example in which the gate G is used as a mask, the semiconductor layer may be lightly doped with N-type or P-type dopant. In one case, a region which is not lightly doped with the dopant through the use of gate G may function as the active area A of the TFT.

A photoresist (PR) may be formed to cover the gate G and some of the lightly-doped active area A. Then, in an example in which the photoresist (PR) is used as a mask, the semiconductor layer may be heavily doped with N-type or P-type dopant, to form the source S and drain D of the TFT. In one case, a region which is not heavily doped with the dopant through the use of photoresist (PR) may become the LDD.

In a wet-etching process of the gate G for the manufacturing process, the LDD length may be adjusted by controlling a critical dimension (CD). Also, the LDD length may be adjusted by the change of critical dimension (CD) of photoresist (PR) used as the mask when the semiconductor layer is heavily doped with the dopant (for example N$^+$ doping or P$^+$ doping) for the manufacturing process. In one example, the LDD length ratio of the pixel TFT to the buffer TFT may be adjusted to 1:0.7-1:0.9.

For example, a length of one side of the LDD in the pixel TFT of the active area corresponding to the display area may be about 1.0-2.0 μm±0.1 μm, and the entire LDD length of the pixel TFT may be about 2.0-4.0 μm±0.2 μm.

Meanwhile, a length of one side of the LDD in the TFT of the GIP buffer 210 of the non-display area may be 0.7-1.7 μm±0.1 μm, and the entire LDD length of the buffer TFT may be about 1.4-3.4 μm±0.2 μm.

As shown above, the LDD length of the pixel TFT may be different from the LDD length of the TFT of the GIP buffer 210. That is, the LDD length of the TFT of the GIP buffer 210 may be shorter than the LDD length of the pixel TFT. Thus, $R_{on}$ characteristics may be improved by decreasing series resistance between the source and drain of the TFT, to improve display and touch driving characteristics.

Figure 8:
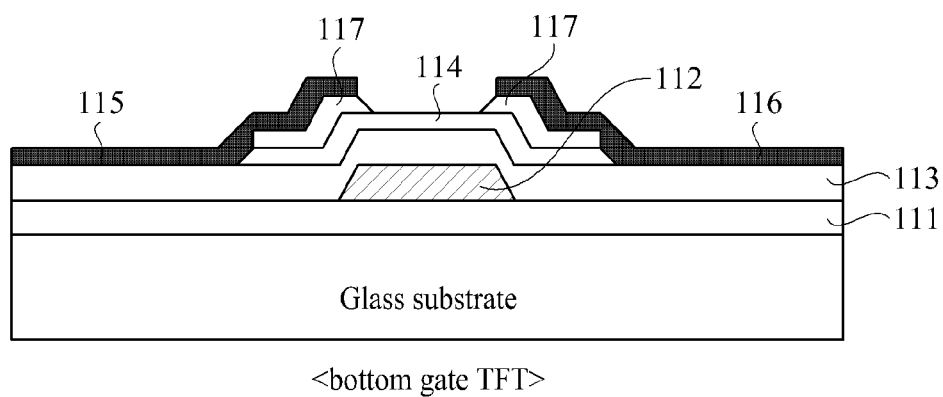
FIG. 8 is a cross sectional view illustrating the TFT with a bottom gate structure according to an example embodiment.
Figure 9:
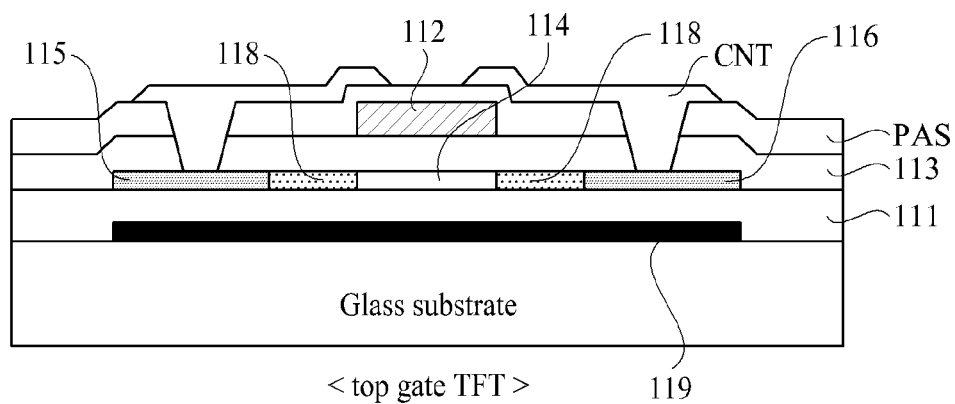
FIG. 9 is a cross sectional view illustrating the TFT with a top gate structure according to an example embodiment.

FIG. 8 is a cross sectional view illustrating an example embodiment of a TFT with a bottom gate structure. FIG. 9 is a cross sectional view illustrating an example embodiment of a TFT with a top gate structure.

As shown in FIG. 8, both the pixel TFT of the active area 100 and the TFT of the GIP buffer 210 may be provided in the bottom gate structure by forming a gate 112 below an active area 114.

In FIG. 8, a buffer layer 111 may be formed on a glass substrate, wherein the buffer layer 111 may function as a blocking layer for protecting the active area 114. The gate 112 may be formed on the buffer layer 111. Then, a gate insulating layer (GI) 113 may be formed on the entire surface of the glass substrate, to cover the gate 112. The active area 114 may be formed on the gate insulating layer 113.

Also, a source 115 may be formed at one side of the active area 114, and a drain 116 may be formed at the other side of the active area 114. Between the active area 114 and source/drain 115/116, there may be a heavily-doped layer (N$^+$a-Si:H) 117.

As shown in FIG. 9, both the pixel TFT of the active area 100 and the TFT of the GIP buffer 210 may be provided in the top gate structure by forming a gate 112 above an active area 114.

In FIG. 9, a light-shielding layer 119 may be formed on a glass substrate. Then, a buffer layer 111 may be formed to cover the light-shielding layer 119, wherein the buffer layer 111 may function as a blocking layer for protecting the active area 114.

On the buffer layer 111, there may be the active area 114, an LDD 118, source 115, and drain 116. The active area 114, LDD 118, source 115, and drain 116 may be formed by implanting impurity ions into the semiconductor layer for forming the active area 114 during the manufacturing process, whereby the active area 114, LDD 118, source 115, and drain 116 may be formed in the same layer.

A gate insulating layer 113 may be formed to cover the active area 114, LDD 118, source 115, and drain 116. The gate 112 may be formed above the gate insulating layer 113, and in one example, the gate 112 may be formed in a predetermined region overlapping with the active area 114 above the gate insulating layer 113.

A passivation layer (PAS) may be formed on the entire surface of the glass substrate, to cover the gate 112. Also, a contact (CNT) may be formed in a predetermined region which may be formed by partially etching the gate insulating layer 113 and passivation layer (PAS) to expose the upper surfaces of the source 115 and drain 116. Through the contact (CNT), the source 115 may be connected with the data line, and the drain 116 may be connected with the pixel electrode.

In an example in which the TFT is applied with the low temperature polysilicon (LTPS), there may be advantages of temperature properties of the top gate method, and a self mask using the gate during the process for forming the LDD. The TFTs of the aforementioned bottom gate implementation and top gate implementation may have advantages and disadvantages. Herein, one example applied with the TFT of the top gate implementation will be described as follows.

The LDD length of the TFT may have great effects on I-V (current-voltage) characteristics and driving reliability. According to an embodiment, the LDD length of the buffer TFT of the GIP may be different from the LDD length of the pixel TFT in the active area, to improve the TFT reliability and TFT off-state characteristics, and also to improve the $R_{on}$ characteristics of the TFT. Also, it may be possible to decrease series resistance of source/drain of the TFT, and to uniformize parasitic capacitance ($C_{DTX}$, $C_{GD}$, $C_{DRX}$, $C_{GRX}$, $C_{Mu}$) inside the panel.

Figure 10:
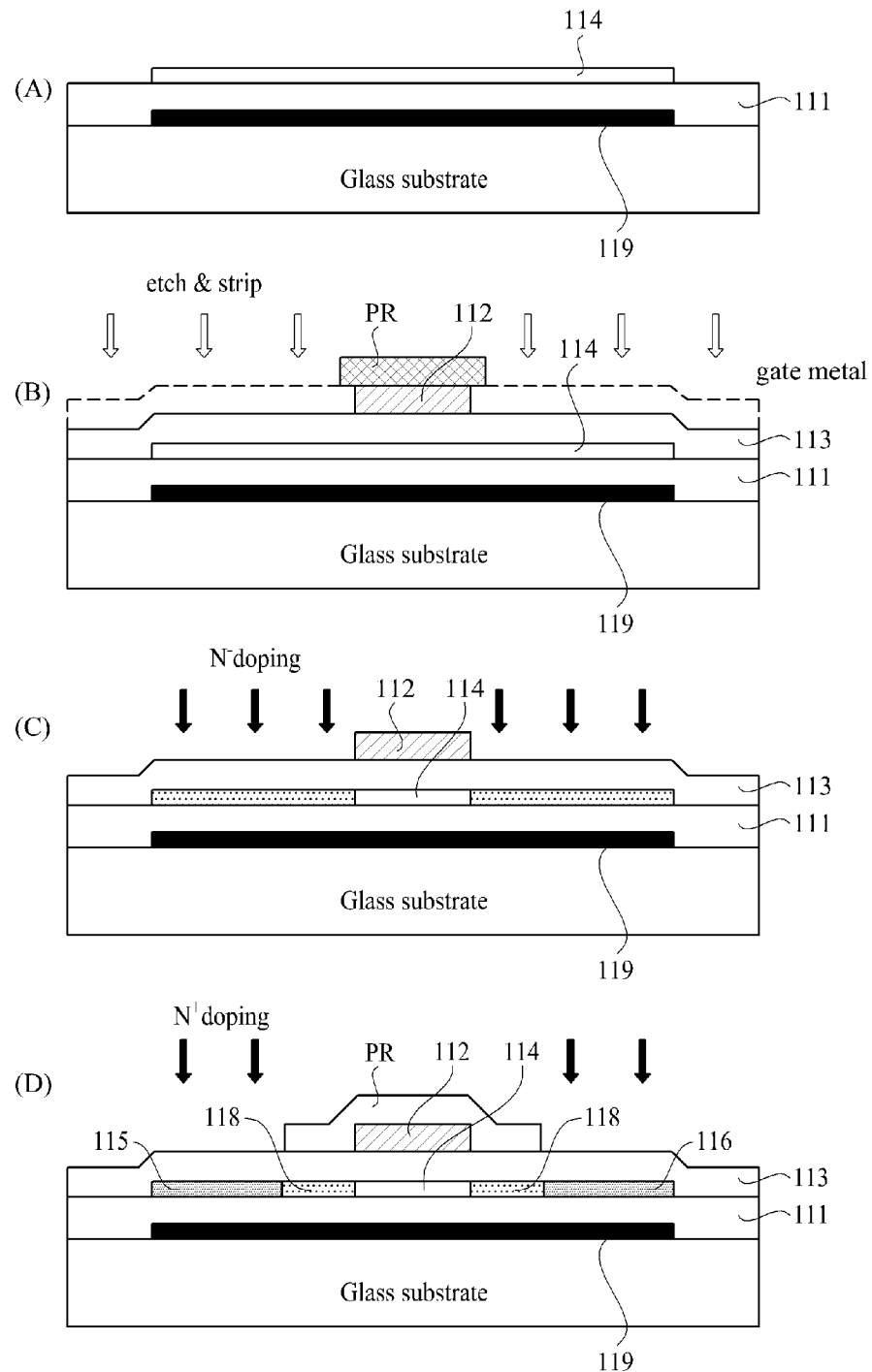
FIGS. 10 and 11 illustrate processes for forming an LDD of the TFT in the LCD device according to an example embodiment.
Figure 11:
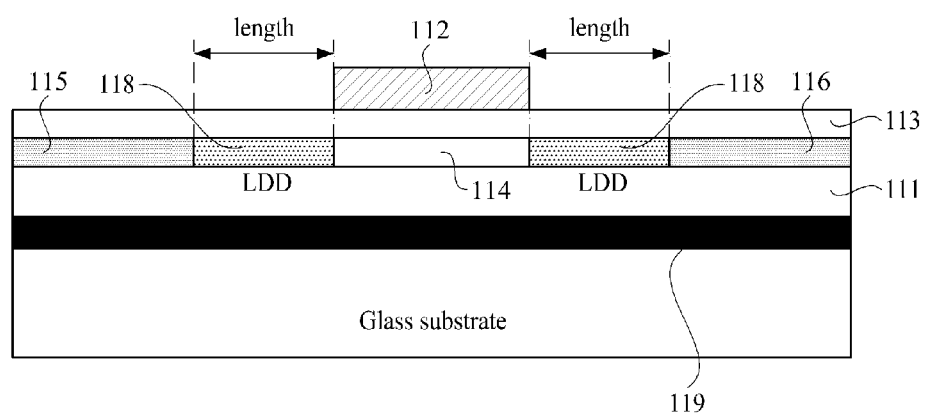

FIGS. 10 and 11 illustrate processes for forming the LDD of the TFT in the LCD device according to an example embodiment.

Hereinafter, the method for forming the LDD of the TFT will be described with reference to FIGS. 10 and 11. After that, the different LDD lengths of the TFTs in the active area and non-display area will be described in more detail.

As shown in FIG. 10A, the light-shielding layer 119 may be formed on the TFT region of the glass substrate, wherein the light-shielding layer 119 may prevent the light emitted from the backlight unit from being incident on the active area. Then, the buffer layer 111 may be formed on the entire surface of the glass substrate, to cover the light-shielding layer 119.

In one example, the light-shielding layer 119 may be formed of opaque metal capable of blocking out the light, for example, molybdenum (Mo) or aluminum (Al), wherein the light-shielding layer 119 may be formed at a thickness of 500 Å.

The buffer layer 111 may be formed of an inorganic material, for example, SiO$_2$ or SiN$_x$, wherein the buffer layer 111 may be formed at a thickness of 2000-3000 Å.

The active area 114 of TFT may be formed on the buffer layer 111, and in one example, in a predetermined region overlapping with the light-shielding layer 119, wherein the active area 114 may be formed of a semiconductor material.

In one case, the active area 114 may be formed of amorphous silicon (a-Si:H) or low temperature polysilicon (P—Si), wherein the active area 114 may be formed at a thickness of 500 Å.

Then, as shown in FIG. 10B, the gate insulating layer (GI) 113 may be formed on the entire surface of the glass substrate, to cover the active area 114 and buffer layer 111.

In one example, the gate insulating layer 113 may be formed of SiO$_2$ or SiN$_x$, wherein the gate insulating layer 113 may be formed at a thickness of 1300 Å.

The gate insulating layer 113 may be formed by depositing TEOS (Tetra Ethyl Ortho Silicate) or MTO (Middle Temperature Oxide) through CVD (Chemical Vapor Deposition).

A gate metal may be formed by depositing conductive metal materials, for example, molybdenum (Mo), aluminum (Al), chrome (Cr), aurum (gold) (Au), titanium (Ti), nickel (Ni), neodymium (Nd), and copper (Cu) on the gate insulating layer 113, or by depositing an alloy of the above conductive metal materials on the gate insulating layer 113.

Thereafter, the wet-etching process using a first photoresist (PR) may be performed to pattern the gate metal.

Then, a stripping and dry-etching process may be performed to the first photoresist (PR) remaining on the gate metal, whereby the gate 112 of TFT may be formed in the predetermined region overlapping with the active area 114 above the gate insulating layer 113. In one example, the gate 112 may be formed at a thickness of 3000 Å.

As shown in FIG. 10C, in an example in which the gate 112 is used as a mask, the peripheral region of the semiconductor layer may be lightly doped with the N-type or P-type dopant (for example, $N^-$ doping or $P^-$ doping). In this case, the region which is not lightly doped with the dopant through the use of gate 112 may function as the active area 114 of the TFT, and the LDD may be formed in the region which may be lightly doped with the N-type or P-type dopant.

As shown in FIG. 10D, a second photoresist may be formed to cover the gate 112 and some portions of the active area 114 lightly doped with the dopant. In an example in which the second photoresist is used as a mask, the peripheral region of the active may be heavily doped with the N-type or P-type dopant (for example, $N^+$ doping or $P^+$ doping).

In one example, the region which is heavily doped with the dopant may become the source 115 and drain 116. Then, the region which is not heavily doped with the dopant through the use of second photoresist may become the LDD 118.

Accordingly, the TFT may include the gate 112 together with the active area 114, LDD 118, source 115, and drain 116, wherein the gate insulating layer 113 may be interposed between the gate 112 and the active area 114, LDD 118, source 115, and drain 116.

Through the aforementioned manufacturing process, the pixel TFT with the LDD of a first length may be formed in the display area, and the buffer TFT and tail TFT with the LDD of a second length may be formed in the non-display area.

Although not shown, an interlayer dielectric (ILD) and passivation layer (PAS) may be formed on the gate 112 through the following manufacturing process. Also, a contact (CNT) may be formed between the source 115 and the data line, and a contact (CNT) may be formed between the drain 116 and the pixel electrode.

In one example, the interlayer dielectric (ILD) may be formed of $SiO_2$ or $SiN_x$, wherein the interlayer dielectric (ILD) may be formed at a thickness of 6000 Å. According to an example, the interlayer dielectric (ILD) may be formed in a deposition structure of $SiO_2$ (3000 Å)/$SiN_x$ (3000 Å).

The passivation layer (PAS) may be formed of photo-acryl (PAC), wherein the passivation layer (PAS) of 2.0 μm-3.0 μm may planarize the entire surface of the glass substrate.

The contact (CNT) may be formed of a conductive metal material, for example, molybdenum (Mo), aluminum (Al), chrome (Cr), aurum (gold) (Au), titanium (Ti), nickel (Ni), neodymium (Nd), and copper (Cu), wherein the contact (CNT) may be formed at a thickness of 6000 Å.

According to another example, the contact (CNT) may be formed in a deposition structure of molybdenum/aluminum/molybdenum.

Then, the common electrode (Vcom electrode) may be formed on the passivation layer. In one example, the common electrode may be formed of a transparent conductive material, for example, ITO (indium tin oxide), IZO (indium zinc oxide), or ITZO (indium tin zinc oxide), wherein the common electrode may be formed at a thickness of 500 Å.

Thereafter, an insulating layer may be formed to cover the common electrode, and the pixel electrode may be formed on the insulating layer. In one example, the pixel electrode may be formed of a transparent conductive material, for example, ITO (indium tin oxide), IZO (indium zinc oxide), or ITZO (indium tin zinc oxide), wherein the pixel electrode may be formed at a thickness of 500 Å.

Meanwhile, the sensing line may be connected with the common electrode, whereby the common electrode may be driven as the touch electrode for the non-display period.

Embodiments may include that the LDD length of TFT in the active area be different from the LDD length of TFT in the non-display area. Thus, the detailed explanation for the structure of touch sensing line for driving the common electrode as the touch electrode for the non-display period and its contact method will be omitted.

The aforementioned description shows the example of a "pixel electrode on top structure" (PXL on top structure) in which the pixel electrode is formed on the common electrode, which is only one example of an embodiment. According to another example, there may be a "common electrode on top structure" (Vcom on top structure) in which the common electrode is formed on the pixel electrode.

In the LCD device with the aforementioned structure according to an embodiment, the alignment of liquid crystal layer may be controlled by a fringe field occurring between the common electrode and the pixel electrode, to thereby display images.

For the non-display period, the common electrodes of the pixels connected through the touch sensing line may be driven as touch sensing electrodes, to sense the user's touch.

According to the user's touch, a touch capacitance may be formed between the common electrodes of color filter array substrate (upper substrate) and thin film transistor array substrate (lower substrate). Thus, the user's touch location may be detected by sensing the change of capacitance according to the touch.

With reference to FIG. 11, when forming the gate 112, the LDD length may be determined by the difference between the critical dimension (CD) for the wet-etching process and the critical dimension (CD) of PR used as the mask for the process of heavily doping the dopant (for example, $N^+$ doping).

According to an embodiment, the LDD length of the pixel TFT in the active area and the LDD length of the GIP buffer TFT in the non-display area may be adjusted by controlling at least one of the critical dimension (CD) of gate 112 and the critical dimension (CD) of PR. That is, the LDD length of the pixel TFT in the active area may be different from the LDD length of the GIP buffer TFT in the non-display area.

Figure 12:
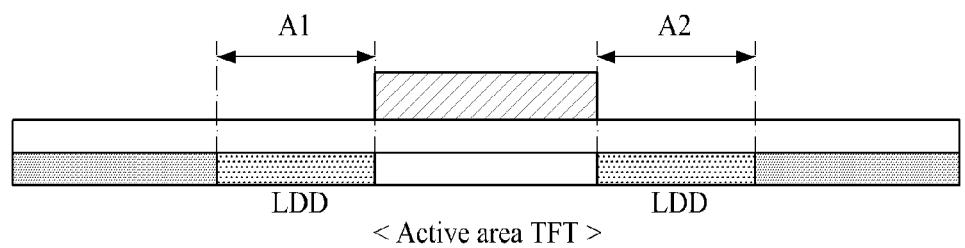
FIG. 12 illustrates that an LDD length of pixel TFT of an active area is different from an LDD length of GIP buffer TFT in the LCD device according to an example embodiment.
Figure 12:
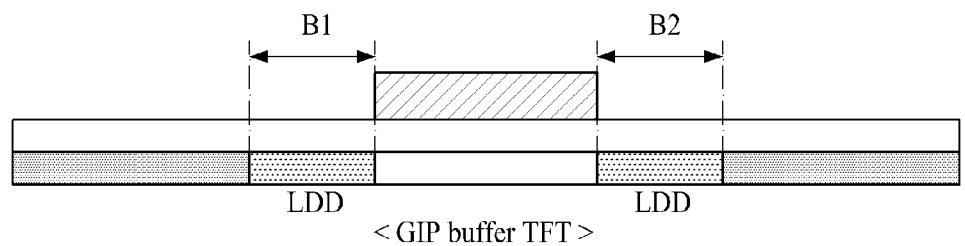
Figure 12:
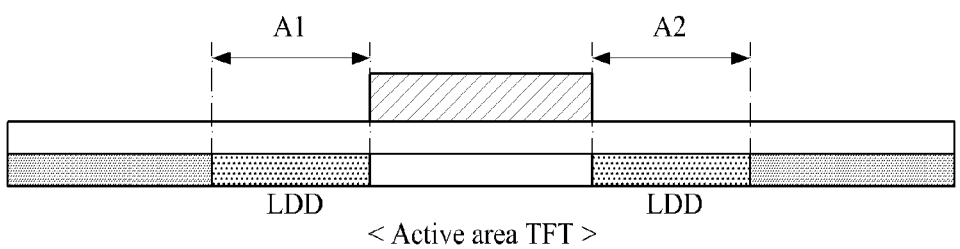
Figure 12:
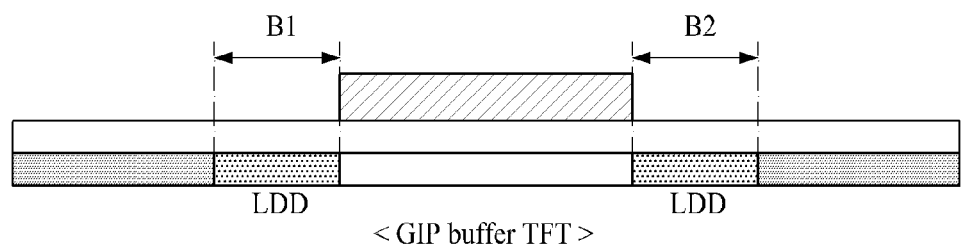

FIG. 12 illustrates that the LDD length of the pixel TFT of the active area may be different from the LDD length of the GIP buffer TFT of the non-display area in the LCD device according to an example embodiment.

With reference to FIG. 12, a length (A1, A2) of one side of the LDD in the pixel TFT of the active area may be about 1.0-2.0 μm±0.1 μm, and the entire LDD length of the pixel TFT may be about 2.0-4.0 μm±0.2 μm.

Meanwhile, a length (B1, B2) of one side of the LDD in the GIP buffer TFT of the non-display area may be 0.7-1.7 μm±0.1 μm, and the entire LDD length of the buffer TFT may be about 1.4-3.4 μm±0.2 μm.

As shown in FIG. 12, the LDD length (A) of the pixel TFT may be longer than the LDD length (B) of the buffer TFT (that is, A>B). In one example, the LDD length ratio of the pixel TFT to the buffer TFT may be adjusted to 1:0.7-1:0.9.

The LDD length of the buffer TFT may be designed in consideration of reliability of the GIP buffer TFT. In comparison with the related art, the LDD length of the buffer TFT may become shorter such that it may be possible to improve the $R_{on}$ characteristics by decreasing series resistance between the source and drain of the TFT.

The LDD length of the pixel TFT may be designed in consideration of the leakage current characteristics and parasitic capacitance inside the panel (gate to source/drain capacitance) when the pixel TFT is turned off.

Figure 13:
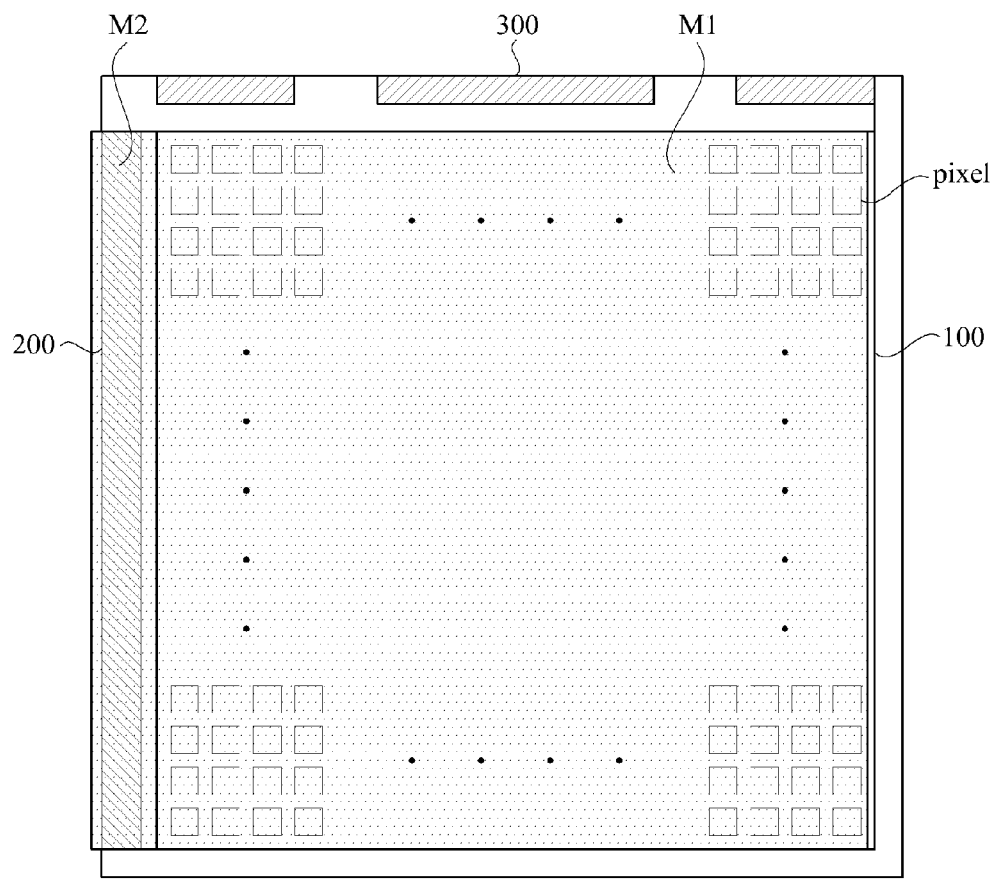
FIG. 13 illustrates a method for forming the different LDD lengths in the pixel TFT of the active area and the GIP buffer TFT of the LCD device according to an example embodiment.

FIG. 13 illustrates a method for forming the different LDD lengths in the pixel TFT of the active area and the GIP buffer TFT of the non-display area of the LCD device according to an example embodiment.

For the manufacturing process, with reference to FIG. 13, a first mask (M1) is applied to the active area, and a second mask (M2) is additionally applied to the non-display area, to control the critical dimension (CD) of the gate 112.

Meanwhile, both the gates of the pixel TFT and the buffer TFT may be formed through the use of one mask. In one example, mask patterns for the active area and the non-display area may be different from each other, whereby the critical dimension (CD) in the gate of the pixel TFT may be different from the critical dimension (CD) in the gate of the buffer TFT.

At least one of the critical dimension (CD) of the gate 112 and the critical dimension (CD) of PR used as the mask for the process of heavily doping the dopant may be controlled to adjust the LDD length ratio of the pixel TFT to the buffer TFT and to obtain the different LDD lengths in the pixel TFT and the GIP buffer TFT.

Figure 14:
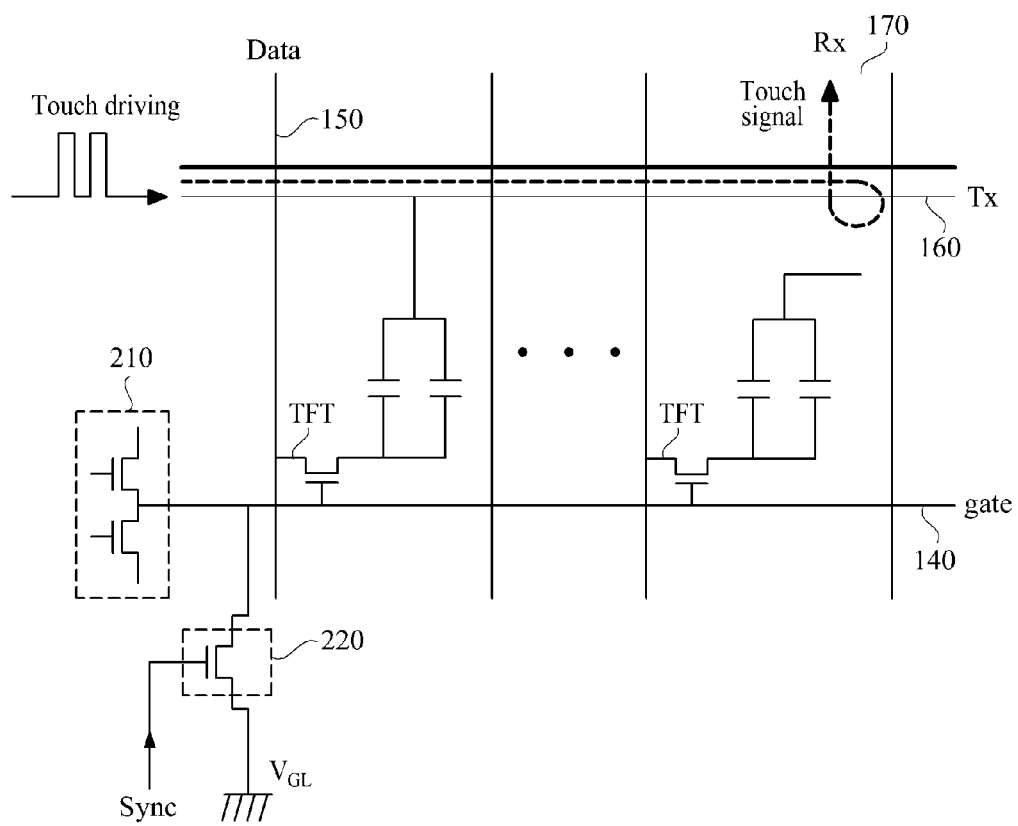
FIG. 14 illustrates an LCD device according to an example embodiment.
Figure 15:
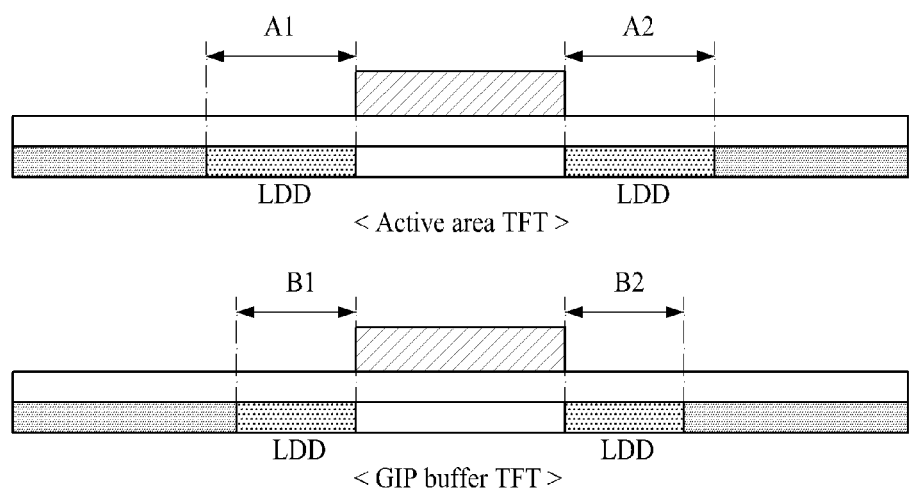
FIG. 15 is a plane view illustrating GIP buffer TFT and tail TFT in the LCD device according to an example embodiment.

FIG. 14 illustrates an LCD device according to an example embodiment. FIG. 15 is a plane view illustrating GIP buffer TFT and tail TFT in the LCD device according to an example embodiment.

With reference to FIGS. 14 and 15, in an example of an in-cell touch type liquid crystal panel applied with a GIP type gate driver, not only displaying images but also touch driving characteristics may be important.

In order to decrease an interference between displaying and touch driving, a tail TFT 220 may be formed. The tail TFT 220 may be formed between a GIP buffer 210 and a pixel TFT.

As shown in FIG. 15, the tail TFT 220 may be identical in structure to the GIP buffer 210.

The tail TFT 220 may erase the scan signal output from the GIP buffer 210 to the gate line 140, whereby it may become a VGL level. For the non-display period, that is, touch period, the scan signal may be erased to be the VGL level.

Accordingly, it may be possible to decrease the interference between displaying and touch driving, and to prevent noise caused by the touch driving signal leaking to the parasitic capacitance inside the liquid crystal panel from being increased.

In the LCD device according to an example embodiment, an LDD length of the pixel TFT may be different from an LDD length of the tail TFT 220.

To decrease the interference between displaying and touch driving, $R_{on}$ characteristics of the tail TFT 220 may be improved. For this, the LCD device according to an embodiment of the present disclosure may be provided in such a manner that the LDD length of the tail TFT 220 may be shorter than the LDD length of the pixel TFT.

In one example, the LDD length ratio of the pixel TFT to the TFT of GIP buffer 210 may be adjusted to 1:0.7-1:0.9. Also, the LDD length ratio of the pixel TFT to the tail TFT 220 may be adjusted to 1:0.7-1:0.9.

Meanwhile, the LDD length ratio of the pixel TFT to the TFT of GIP buffer 210 may be adjusted to 1:0.7-1:0.9. Also, the LDD length ratio of the pixel TFT to the tail TFT 220 may be adjusted to 1:0.5-1:0.7.

Figure 16:
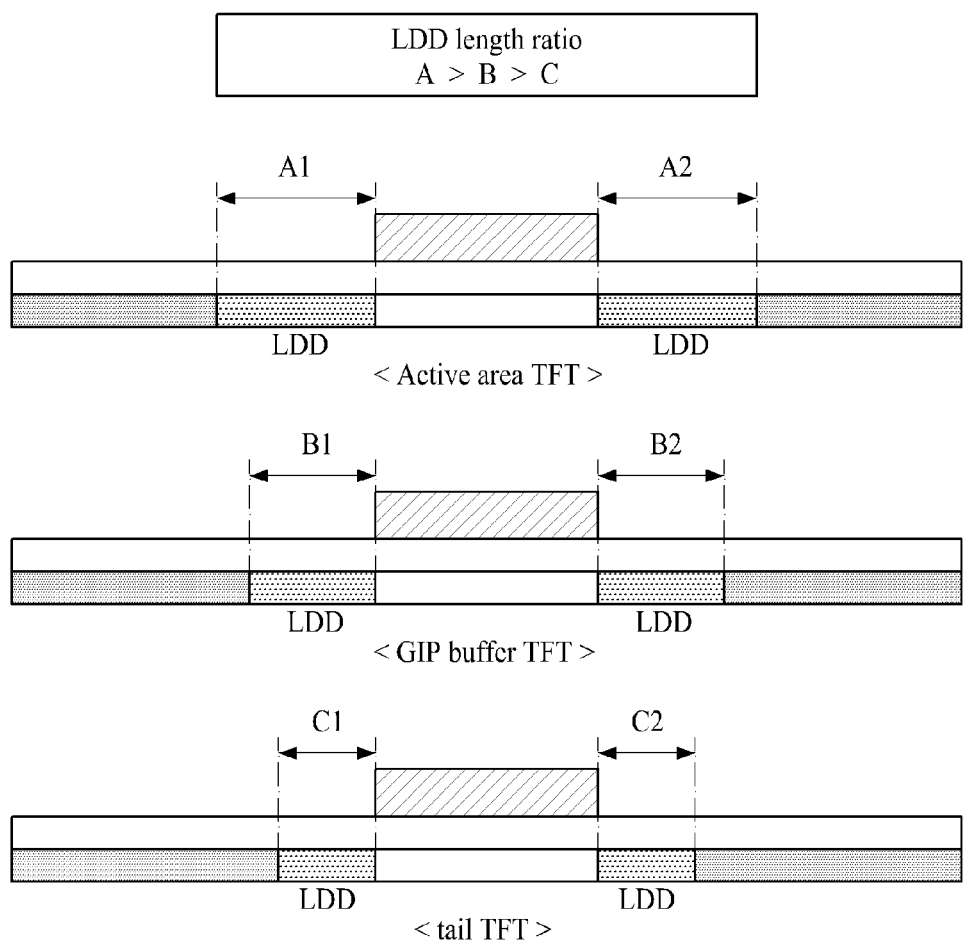
FIGS. 16 and 17 illustrate that a pixel TFT of active area, a GIP buffer TFT, and a tail TFT in the LCD device according to an example embodiment have different LDD lengths.
Figure 17:
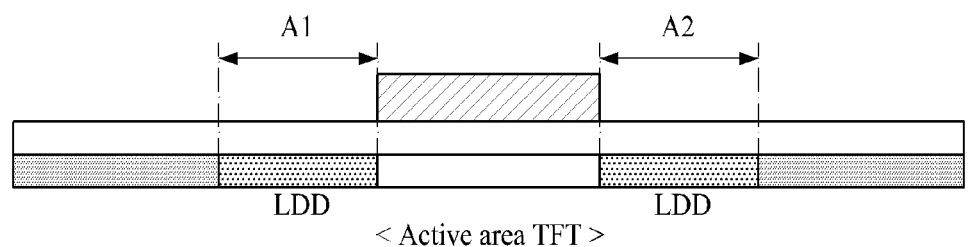
Figure 17:
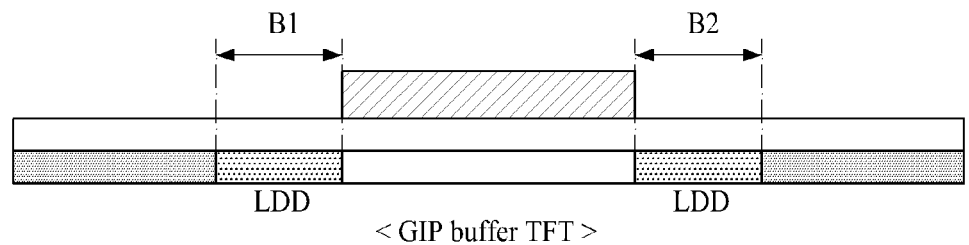
Figure 17:
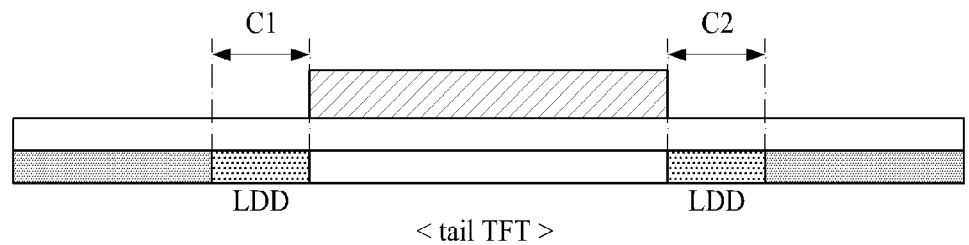

FIGS. 16 and 17 illustrate that the pixel TFT of active area, the GIP buffer TFT, and the tail TFT in the LCD device according to an example embodiment may have the different LDD lengths.

With reference to FIGS. 16 and 17, a length (A1, A2) of one side of the LDD in the pixel TFT of the active area is about 1.0-2.0 μm±0.1 μm, and the entire LDD length of the pixel TFT may be about 2.0-4.0 μm±0.2 μm.

Meanwhile, a length (B1, B2) of one side of the LDD in the TFT of the GIP buffer 210 of the non-display area may be 0.7-1.7 μm±0.1 μm, and the entire LDD length in the TFT of the buffer TFT 210 may be about 1.4-3.4 μm±0.2 μm.

Also, a length (C1, C2) of one side of the LDD in the tail TFT 220 of the non-display area may be 0.5-1.5 μm±0.1 μm, and the entire LDD length of the tail TFT 220 may be about 1.0-3.0 μm±0.2 μm.

As shown in FIGS. 16 and 17, the LDD length (A) of the pixel TFT may be longer than the LDD length of the buffer TFT (that is, A>B).

Also, the LDD length (B) of the buffer TFT may be longer than the LDD length (C) of the tail TFT (that is, B>C).

Thus, the LDD length (A) of the pixel TFT, the LDD length (B) of the buffer TFT, and the LDD length (C) of the tail TFT 220 may be provided in order of A>B>C.

In one example, the LDD length of the tail TFT 220 may be designed to decrease the interference between displaying and touch driving, and to improve $R_{on}$ characteristics of the TFT. In comparison with the related art, each of the LDD length of the buffer TFT and the LDD length of the tail TFT 220 may be shorter than the LDD length of the pixel TFT so that it may be possible to improve $R_{on}$ characteristics by decreasing series resistance between source and drain electrodes of the TFT.

For the manufacturing process, the LDD length of the tail TFT 220 may be adjusted by controlling at least one of the critical dimension (CD) of gate 112 and the critical dimension (CD) of photoresist (PR) through the use of a third mask in addition to the masks used for forming the pixel TFT and the buffer TFT.

Thus, the LDD length ratio of the pixel TFT, the buffer TFT, and the tail TFT 220 may be determined, wherein the pixel TFT, the buffer TFT, and the tail TFT 220 may have the different LDD lengths from one another.

Figure 18:
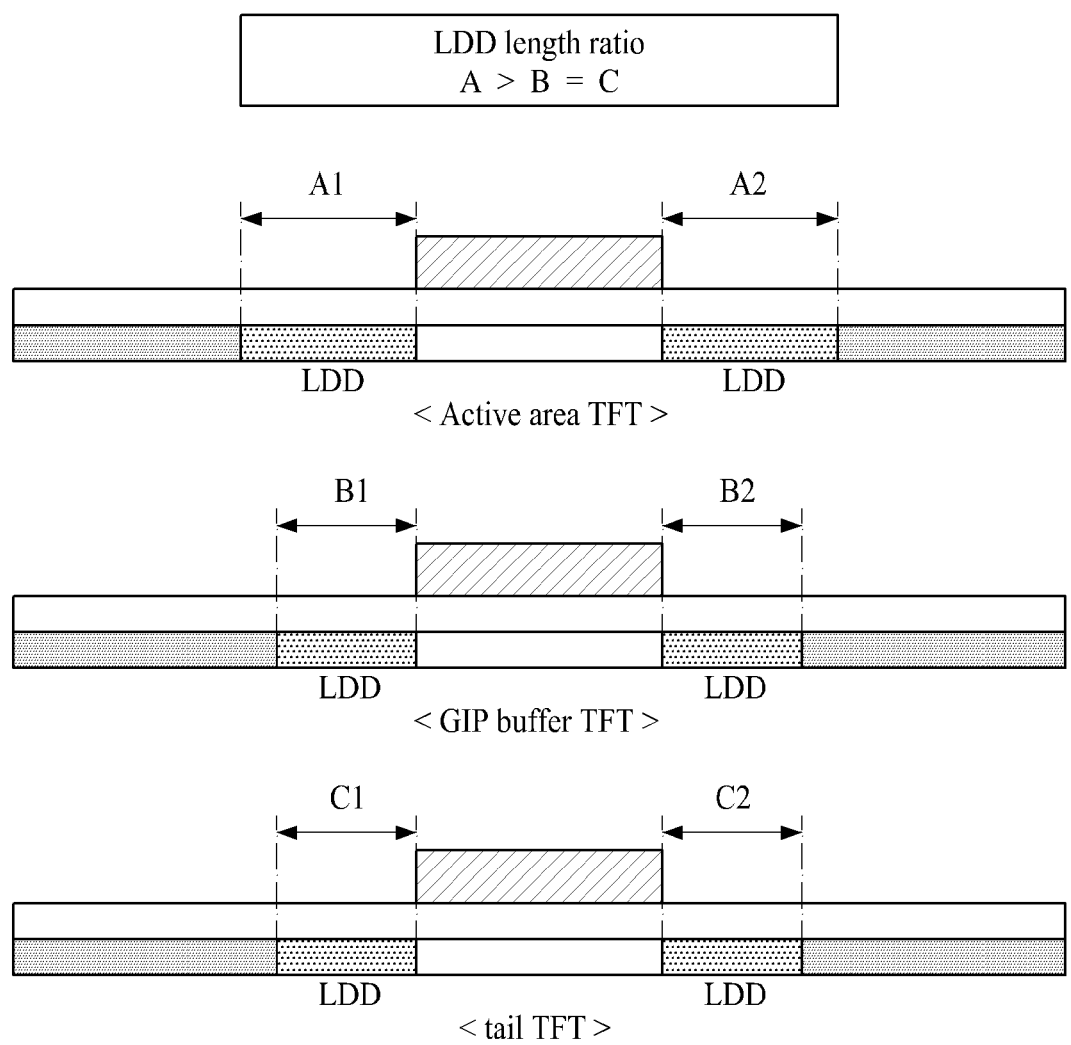
FIGS. 18 and 19 illustrate that the pixel TFT of an active area and the TFT of a non-display area in the LCD device according to an example embodiment of the present disclosure have different LDD lengths.
Figure 19:
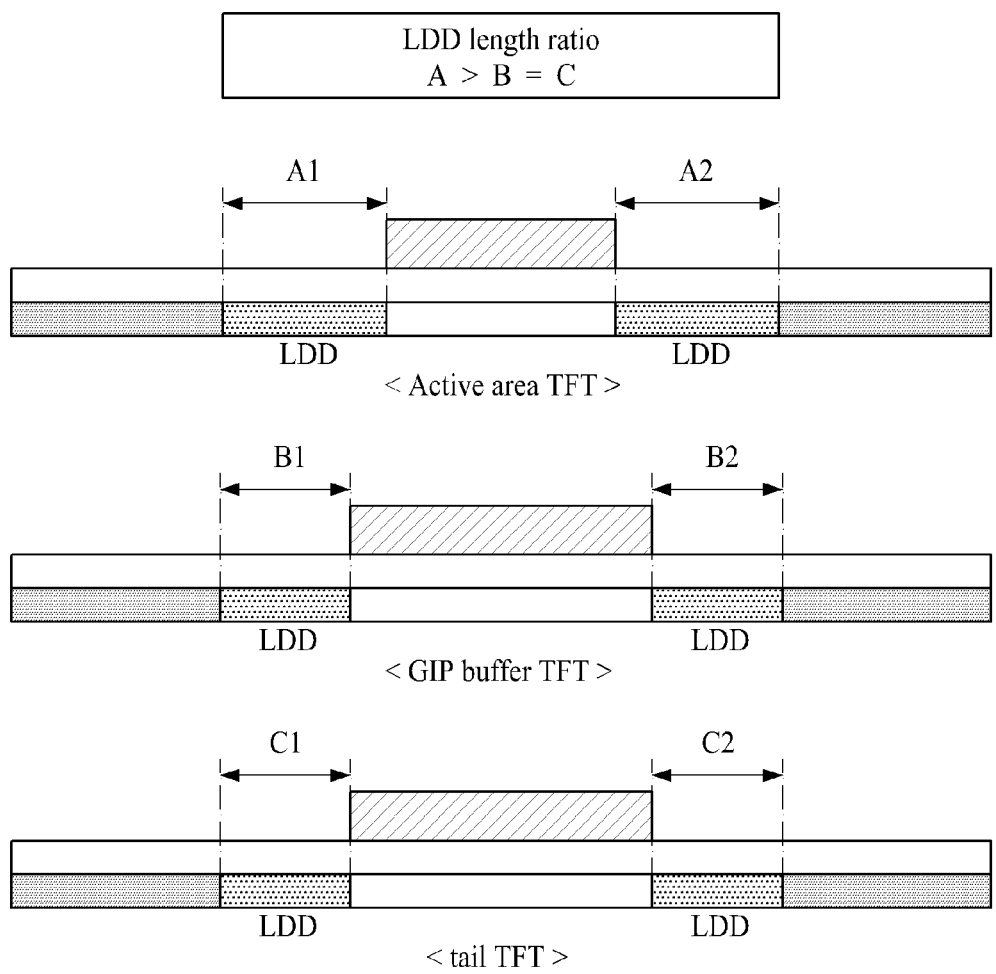

FIGS. 18 and 19 illustrate that the pixel TFT of active area and the TFT of the non-display area in the LCD device according to an example embodiment may have the different LDD lengths.

With reference to FIGS. 18 and 19, in an example of the LCD device according to an embodiment, each of the LDD length of buffer TFT and the LDD length of tail TFT may be shorter than the LDD length of the pixel TFT. In one example, the LDD length of the buffer TFT may be the same as the LDD length of the tail TFT.

In more detail, a length (A1, A2) of one side of the LDD in the pixel TFT of the active area may be about 1.0-2.0 μm±0.1 μm, and the entire LDD length of the pixel TFT may be about 2.0-4.0 μm±0.2 μm.

Meanwhile, a length (B1, B2, C1, C2) of one side of the LDD in each of the GIP buffer TFT and the tail TFT may be 0.7-1.7 μm±0.1 μm, and the entire LDD length thereof may be about 1.4-3.4 μm±0.2 μm.

However, embodiments are not limited to the above. For example, a length (B1, B2, C1, C2) of one side of the LDD in each of the GIP buffer TFT and the tail TFT may be 0.5-1.5 μm±0.1 μm, and the entire LDD length thereof may be about 1.0-3.0 μm±0.2 μm.

As shown in FIGS. 18 and 19, the LDD length (A) of the pixel TFT may be longer than each of the LDD length (B) of the buffer TFT and the LDD length (C) of the tail TFT. Thus, the LDD length (A) of the pixel TFT, the LDD length (B) of the buffer TFT, and the LDD length (C) of the tail TFT may be provided in order of A>B=C.

For the manufacturing process, at least one of the critical dimension (CD) of the gate 112 and the critical dimension (CD) of photoresist (PR) may be controlled through the use of an additionally-provided mask in addition to a mask used for forming the pixel TFT, to determine the LDD length ratio of the pixel TFT, the buffer TFT, and the tail TFT.

In an LCD device according to embodiments, the LDD length of the TFT of the active area may be different from the LDD length of the TFT of the non-display area.

The LCD device according to embodiments may improve display and touch characteristics of the in-cell touch panel by differently forming the LDD length in the pixel TFT of the active area and the TFT of the non-display area.

Figure 20:
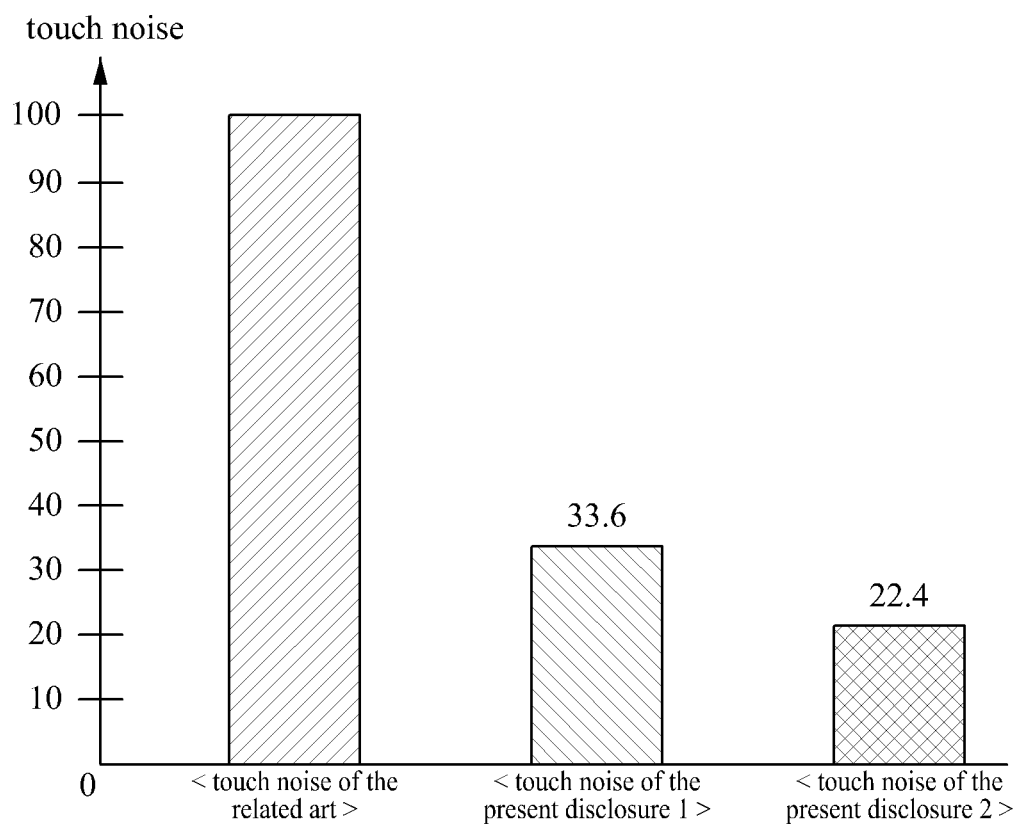
FIG. 20 illustrates the LCD device with the improved touch characteristics according to example embodiments of the present disclosure in comparison with the LCD device according to the related art.

FIG. 20 illustrates the LCD device with improved touch characteristics according to example embodiments in comparison with the LCD device according to the related art.

With reference to FIG. 20, a touch noise of the LCD device according to the related art is measured, and a touch noise of the LCD device according to embodiments of the present disclosure is measured.

As shown in FIG. 20, if comparing the touch noise of an embodiment ("present disclosure 1" in FIG. 20) with the touch noise of the related art, the touch noise of the LCD device according to the related art is set to 100%, and the touch noise of the LCD device with the tail TFT according to an embodiment of the present disclosure (present disclosure 1) is 33.6% in comparison with the related art. That is, FIG. 20 shows that the touch noise in the LCD device according to embodiments of the present disclosure may be largely decreased.

Then, if comparing the touch noise of another embodiment ("present disclosure 2" in FIG. 20) with the touch noise of the related art, the touch noise of the LCD device with the different LDD lengths in the TFT pixel of the active area and the buffer TFT and tail TFT of the non-display area according to the present disclosure (present disclosure 2) is about 22.4% in comparison with the related art, that is, the touch noise in the LCD device according to embodiments of the present disclosure may be largely decreased.

The LCD device according to the aforementioned embodiments of the present disclosure may improve the touch characteristics by decreasing the touch noise.

In the LCD device according to embodiments of the present disclosure, the LDD length of the pixel TFT in the active area may be different from the LDD length of the TFT in the non-display area, to decrease the interference between displaying and touch driving of the in-cell touch panel.

Also, it may be possible to improve $R_{on}$ characteristics of the TFT, and to decrease the noise inside the liquid crystal panel on the touch driving.

Also, the LDD length of the GIP buffer TFT may be adjusted to improve reliability of the GIP buffer TFT, and to improve the leakage current characteristics in the off-state pixel TFT, and uniformity of the parasitic capacitance inside the panel.

According to embodiments, the LDD length of the pixel TFT in the active area may be different from the LDD length of the TFT in the non-display area, to improve the display and touch characteristics of the in-cell touch panel.

Accordingly, as the LDD length of the pixel TFT in the active area may be different from the LDD length of the TFT in the non-display area, it may be possible to decrease the interference between displaying and touch driving of the in-cell touch panel.

Also, it may be possible to improve the $R_{on}$ characteristics.

The LCD device according to embodiments of the present disclosure may decrease the touch noise inside the liquid crystal panel on the touch driving.

Also, the LCD device according to embodiments may improve the reliability of GIP buffer TFT by adjusting the LDD length of the GIP buffer TFT.

In addition, the LCD device according to embodiments may improve the leakage current characteristics of the off-state pixel TFT and the uniformity of parasitic capacitance inside the panel by adjusting the LDD length of the pixel TFT.

Furthermore, the LCD device according to embodiments may improve the $R_{on}$ characteristics of TFT by adjusting the LDD length of the tail TFT connected with the GIP buffer.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A liquid crystal display (LCD) with a touch function, comprising:
   a first thin film transistor (TFT) in a display area;
   a second TFT of a gate driver in a non-display area, and
   a third TFT connected between the first TFT and the second TFT,
   wherein a lightly-doped drain (LDD) length of the second TFT is shorter than a lightly-doped drain (LDD) length of the first TFT, and
   wherein an LDD length of the third TFT is shorter than the LDD length of the first TFT.

2. The LCD device of claim 1, wherein the LDD length ratio of the first TFT to the second TFT is 1:0.7-1:0.9.

3. The LCD device of claim 1, wherein the LDD length of the second TFT is the same as the LDD length of the third TFT.

4. The LCD device of claim 1, wherein the LDD length of the third TFT is shorter than the LDD length of the second TFT.

5. The LCD device of claim 1, wherein:
   the LDD length ratio of the first TFT to the second TFT is 1:0.7-1:0.9; and
   the LDD length ratio of the first TFT to the third is 1:0.5-1:0.9.

6. The LCD device of claim 1, wherein:
a parasitic capacitance inside a liquid crystal panel is uniformized; and
$R_{on}$ characteristics of each TFT is controlled by differently forming the LDD lengths in the respective first TFT, second TFT, and third TFT.

7. The LCD device of claim 1, wherein:
the gate driver is formed in a gate-in-panel method on a TFT array substrate; and
a touch sensor for detecting a user's touch is formed as an in-cell touch panel on the TFT array substrate.

8. A method for manufacturing an LCD device with a touch function, the method comprising:
forming a first thin film transistor (TFT) with a lightly doped drain (LDD) having a first length in a display area;
forming a second TFT of a gate driver with an LDD having a second length in a non-display area, the second length being shorter than the first length; and
forming a third TFT with an LDD having a third length in the non-display area,
wherein the third length is shorter than the first length, and the third TFT is connected between the first TFT and the second TFT.

9. The method of claim 8, wherein the LDD length of the second TFT is the same as the LDD length of the TFT.

10. The method of claim 9, further comprising:
forming a buffer layer on a glass substrate;
forming an active area of a semiconductor material on a predetermined portion of the buffer layer;
forming a gate insulating layer to cover the buffer layer and the active area;
forming a gate metal on the gate insulating layer;
forming a first photoresist mask on the gate metal;
forming a gate in a predetermined portion overlapped with the active area by patterning the gate metal through an etching process; and
lightly doping a peripheral region of the active area with an N-type dopant or a P-type dopant, using the gate as a mask,
wherein the LDD of the first length is formed in a first TFT of the display area, and
wherein the LDD of the second length is formed in a second TFT of the non-display area.

11. The method of claim 10, further comprising:
forming a second photoresist mask to cover the gate and a predetermined portion of the lightly-doped region; and
forming a source and a drain in the peripheral region of the LDD by heavily doping the peripheral region of the lightly-doped region with an N-type dopant or a P-type dopant.

12. The method of claim 10, further comprising, when forming the gate, adjusting the LDD lengths of the first TFT, second TFT, and third TFT by controlling a critical dimension of the gate.

13. The method of claim 11, further comprising, when forming the source and drain, adjusting the LDD lengths of the first TFT, second TFT, and third TFT by controlling a critical dimension of the second photoresist mask to prevent heavy dopant doping.

\* \* \* \* \*